(12) United States Patent
Cha et al.

(10) Patent No.: US 9,082,969 B2
(45) Date of Patent: Jul. 14, 2015

(54) KEYHOLE-FREE SLOPED HEATER FOR PHASE CHANGE MEMORY

(71) Applicant: MICRON TECHNOLOGY, INC., Boise, ID (US)

(72) Inventors: Soonwoo Cha, Portland, OR (US); Tim Minvielle, San Jose, CA (US); Jong Won Lee, Santa Clara, CA (US); Jinwook Lee, San Jose, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 13/923,759

(22) Filed: Jun. 21, 2013

(65) Prior Publication Data

US 2013/0286726 A1 Oct. 31, 2013

Related U.S. Application Data

(62) Division of application No. 12/627,443, filed on Nov. 30, 2009, now Pat. No. 8,470,635.

(51) Int. Cl.
| | | |
|---|---|---|
| *H01L 47/00* | (2006.01) | |
| *H01L 45/00* | (2006.01) | |
| *H01L 27/24* | (2006.01) | |
| *G11C 13/00* | (2006.01) | |

(52) U.S. Cl.
CPC .......... *H01L 45/128* (2013.01); *G11C 13/0004* (2013.01); *H01L 27/2436* (2013.01); *H01L 45/06* (2013.01); *H01L 45/126* (2013.01); *H01L 45/1233* (2013.01); *H01L 45/141* (2013.01); *H01L 45/144* (2013.01); *H01L 45/16* (2013.01)

(58) Field of Classification Search
CPC ................................ H01L 27/00; H01L 45/00
USPC .......................................... 257/E45.002, 3, 4
See application file for complete search history.

(56) References Cited

U.S. PATENT DOCUMENTS

| | | |
|---|---|---|
| 5,807,789 A | 9/1998 | Chen et al. |
| 6,506,674 B2 | 1/2003 | Ikeda et al. |
| 6,569,778 B2 | 5/2003 | Lee et al. |
| 7,119,353 B2 | 10/2006 | Lankhorst et al. |
| 7,307,267 B2 | 12/2007 | Lankhorst et al. |
| 7,349,245 B2 | 3/2008 | Kim et al. |
| 7,514,362 B2 | 4/2009 | Pinnow et al. |
| 7,754,579 B2 | 7/2010 | Wilson et al. |
| 7,820,499 B2 | 10/2010 | Lee |

(Continued)

FOREIGN PATENT DOCUMENTS

| | | |
|---|---|---|
| CN | 1221210 | 6/1999 |
| CN | 1729575 | 2/2006 |

(Continued)

OTHER PUBLICATIONS

Notice of Rejection Grounds dated Jul. 16, 2013, in corresponding Japanese Patent Application No. 2010-265811.

(Continued)

*Primary Examiner* — Telly Green
(74) *Attorney, Agent, or Firm* — Knobbe Martens Olson & Bear LLP

(57) ABSTRACT

Subject matter disclosed herein relates to a method of manufacturing a semiconductor integrated circuit device, and more particularly to a method of fabricating a phase change memory device.

26 Claims, 12 Drawing Sheets

(56) References Cited

U.S. PATENT DOCUMENTS

| | | | |
|---|---|---|---|
| 7,906,368 B2 | 3/2011 | Breitwisch et al. | |
| 8,003,972 B2* | 8/2011 | Liu | 257/4 |
| 8,013,319 B2* | 9/2011 | Chang | 257/3 |
| 8,119,478 B2 | 2/2012 | Jeong et al. | |
| 8,138,028 B2* | 3/2012 | Lung et al. | 438/139 |
| 8,241,514 B2 | 8/2012 | Honda et al. | |
| 2003/0220708 A1 | 11/2003 | Sahin et al. | |
| 2004/0197947 A1 | 10/2004 | Fricke et al. | |
| 2004/0241995 A1 | 12/2004 | Yamanaka | |
| 2006/0049389 A1 | 3/2006 | Lankhorst et al. | |
| 2007/0063180 A1 | 3/2007 | Asano et al. | |
| 2008/0048168 A1 | 2/2008 | Sato | |
| 2008/0101112 A1 | 5/2008 | Chang | |
| 2008/0121862 A1* | 5/2008 | Liu | 257/4 |
| 2008/0191187 A1* | 8/2008 | Lung et al. | 257/4 |
| 2008/0258127 A1 | 10/2008 | Lee et al. | |
| 2009/0008621 A1* | 1/2009 | Lin et al. | 257/3 |
| 2009/0039421 A1 | 2/2009 | Otake | |
| 2009/0098732 A1 | 4/2009 | Cho | |
| 2009/0184353 A1 | 7/2009 | Yamazaki | |
| 2009/0197777 A1 | 8/2009 | Chagovetz et al. | |
| 2009/0262572 A1 | 10/2009 | Krusin-Elbaum et al. | |
| 2009/0275198 A1 | 11/2009 | Kamepalli et al. | |
| 2009/0280599 A1 | 11/2009 | Im et al. | |
| 2009/0321711 A1 | 12/2009 | Takagi et al. | |
| 2011/0299329 A1* | 12/2011 | Liu | 365/163 |

FOREIGN PATENT DOCUMENTS

| | | |
|---|---|---|
| CN | 1996609 | 7/2007 |
| CN | 101038789 | 9/2007 |
| EP | 0871213 | 3/1999 |
| JP | 61-247033 | 11/1986 |
| JP | 7-335625 | 12/1995 |
| JP | 2001-274240 | 10/2001 |
| JP | 2002-110647 | 4/2002 |
| JP | 2004-281571 | 10/2004 |
| JP | 2004-311972 | 11/2004 |
| JP | 2004-312022 | 11/2004 |
| JP | 2008-10737 | 1/2008 |
| JP | 2008-053495 | 3/2008 |
| JP | 2009-177124 | 8/2009 |
| JP | 2009-267432 | 11/2009 |
| WO | WO 2004/057676 | 7/2004 |

OTHER PUBLICATIONS

First Office Action dated Aug. 6, 2013, in corresponding Chinese Patent Application No. 201010568302.0.

Decision of Rejection mailed May 7, 2014, in corresponding Japanese Patent Application No. 2010-265811.

Second Office Action dated May 20, 2014, in corresponding Chinese Patent Application No. 201010568302.0.

Japanese Office Action received in related Japanese Patent Application No. 2010-265811, dated Nov. 18, 2014, 5 pages.

Chinese Office Action received in related Chinese Patent Application No. 201010568302.0, dated Nov. 17, 2014, 6 pages.

Chinese Office Action received in related Chinese Patent Application No. 201010568302.0, dated Mar. 26, 2015, 19 pages.

* cited by examiner

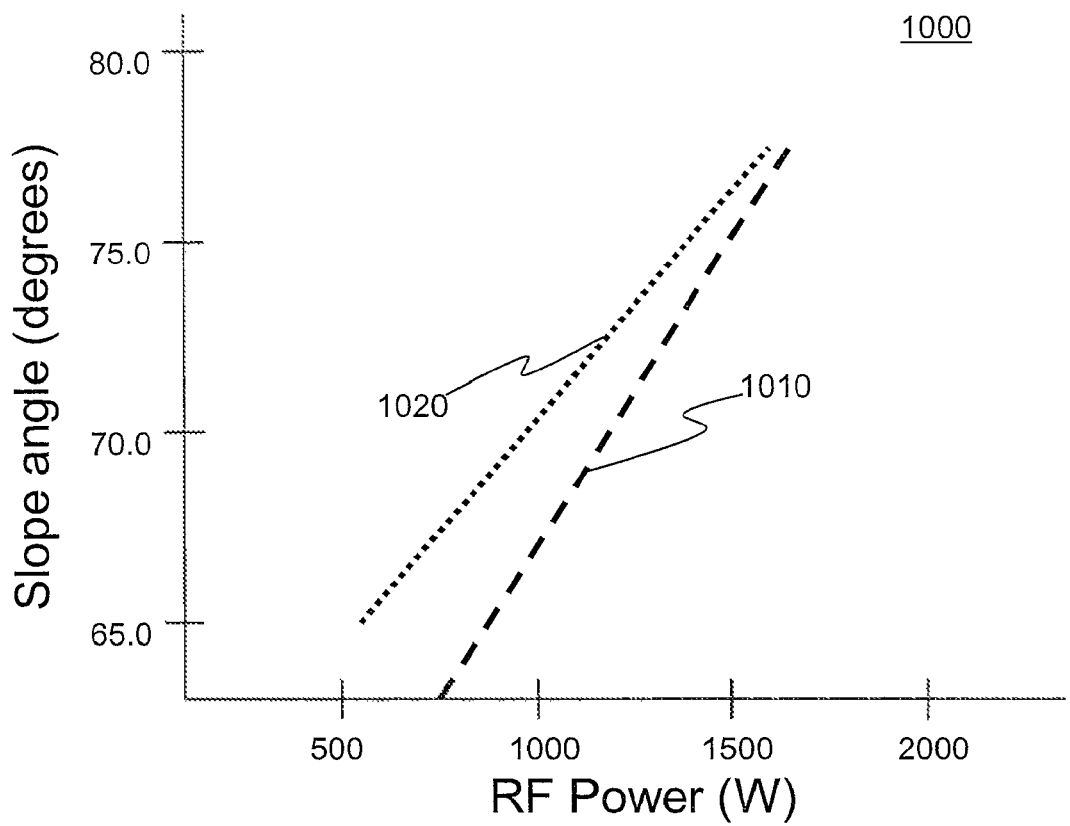
FIG. 10
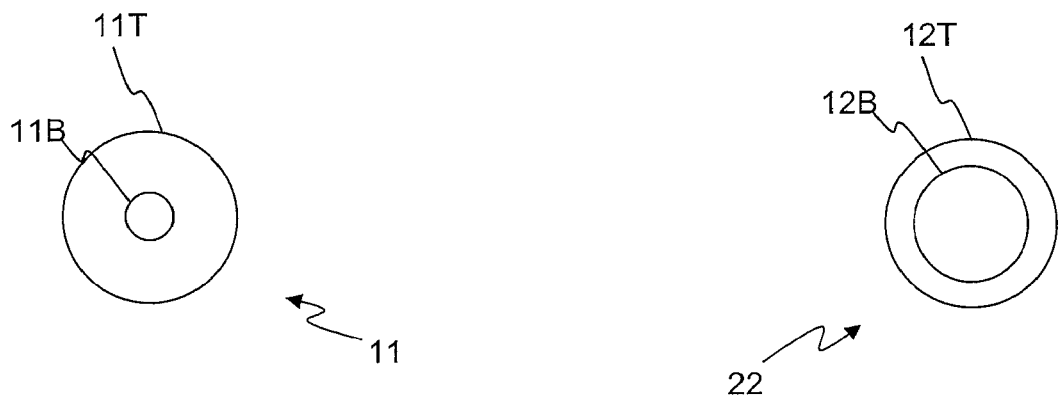
FIG. 11
FIG. 12

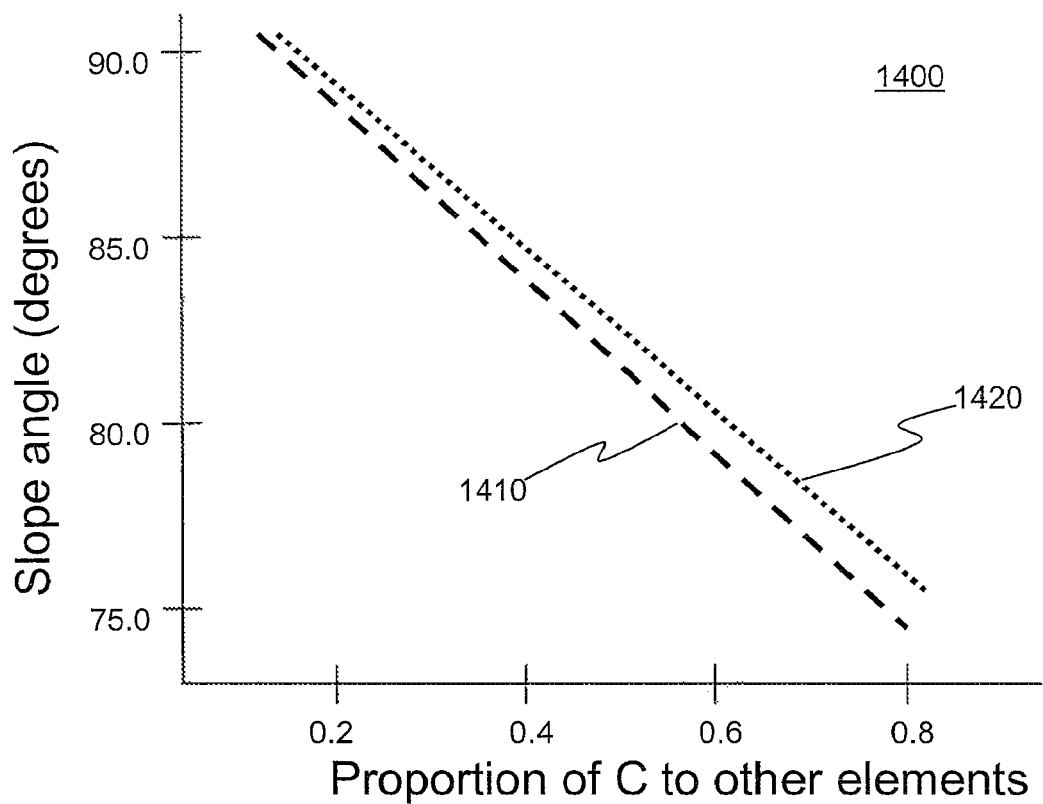
FIG. 14
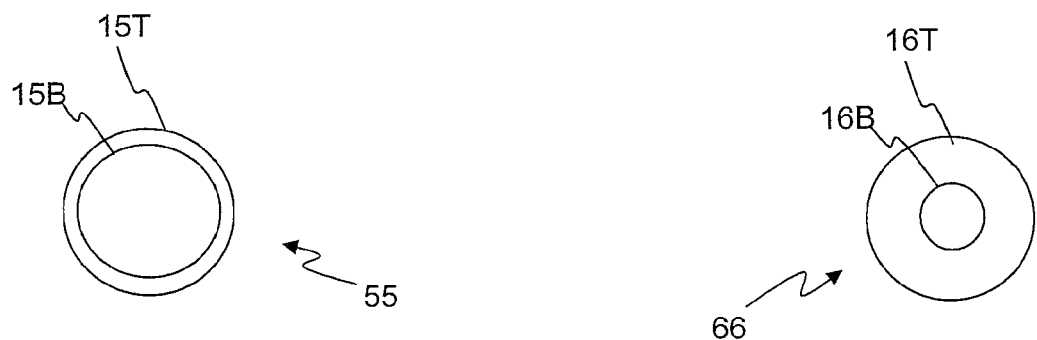
FIG. 15
FIG. 16

KEYHOLE-FREE SLOPED HEATER FOR PHASE CHANGE MEMORY

REFERENCE TO RELATED APPLICATIONS

This application is a divisional of U.S. patent application Ser. No. 12/627,443, filed Nov. 30, 2009, entitled KEYHOLE-FREE SLOPED HEATER FOR PHASE CHANGE MEMORY, which is hereby incorporated by reference in its entirety and made part of this specification.

BACKGROUND

1. Field

Subject matter disclosed herein relates to a method of manufacturing a semiconductor integrated circuit device, and more particularly to a method of fabricating a phase change memory device.

2. Information

Advances in semiconductor process technology generally result in increasingly dense, higher capacity electronic devices, such as memory. Increased density may lead to decreases in feature sizes, or critical dimensions (CD) of such electronic devices. Though higher-density electronic devices are a welcome advance, producing such devices involves challenges. For example, increased density, resulting in an increased aspect ratio (L/D) of semiconductor structures such as contact-like holes, may lead to void (keyhole, seam) issues during a gap-fill process. Such a void may adversely impact phase change memory (PCM) more than for other electronic devices: a PCM memory cell may include a heater to which voltage may be applied in order to produce heat to induce a phase change of chalcogenide material contacting the heater. Voids in a heater may not only physically damage the heater during an operating cycle of a memory cell, but may also affect the extent to which the heater is able to change the phase of chalcogenide materials in the PCM memory cell. Accordingly, such voids may lead to reliability issues of a PCM.

BRIEF DESCRIPTION OF THE FIGURES

Non-limiting and non-exhaustive embodiments will be described with reference to the following figures, wherein like reference numerals refer to like parts throughout the various figures unless otherwise specified.

FIGS. 9 and 10 show example graphs, according to an embodiment.

FIGS. 11 and 12 are top views of etched holes, according to an embodiment.

FIGS. 13 and 14 show example graphs, according to an embodiment.

FIGS. 15 and 16 are top views of etched holes, according to an embodiment.

DETAILED DESCRIPTION

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

In an embodiment, a process to fabricate a portion of a semiconductor device may include deposition of TiSiN that avoids keyholes and/or other voids. For example, TiSiN may be used to form a heater of a phase change memory (PCM) cell. Such a fabrication process may involve one or more particular etch conditions to create a heater having sloped, linear sidewalls. In a particular example, such a heater may be formed by a TiSiN gap-fill process to have a top diameter of substantially 80 nm and a bottom diameter of substantially 50 nm, corresponding to an angle of 81 degrees, though claimed subject matter is not limited to such values. Such a heater may be fabricated, as described in detail below, to be absent of keyholes and/or other voids. Accordingly, such a fabrication process may be beneficial to PCM production, wherein a PCM heater may involve a relatively high aspect ratio in order to maintain a substantial resistance for heating purposes. For example, keyholes and/or other voids in a heater may be avoided by reducing an aspect ratio (e.g., stack height) of the heater, but such a heater may not perform sufficiently, having reduced resistance. Thus, embodiments of a fabrication process described below may result in a keyhole-free heater while maintaining a relatively high aspect ratio.

According to a particular embodiment, a fabrication process may include adjusting one or more physical parameters during etching and/or deposition, such as pressure, radio frequency (RF) power, and/or temperature, for example. As mentioned above, such a process may result in a keyhole-free heater having sloped, linear sidewalls and relatively small critical dimensions (CD) such as a top diameter of substantially 80 nm and a bottom diameter of substantially 50 nm, corresponding to an angle of 81 degrees, though, again, claimed subject matter is not so limited.

Figure 1:
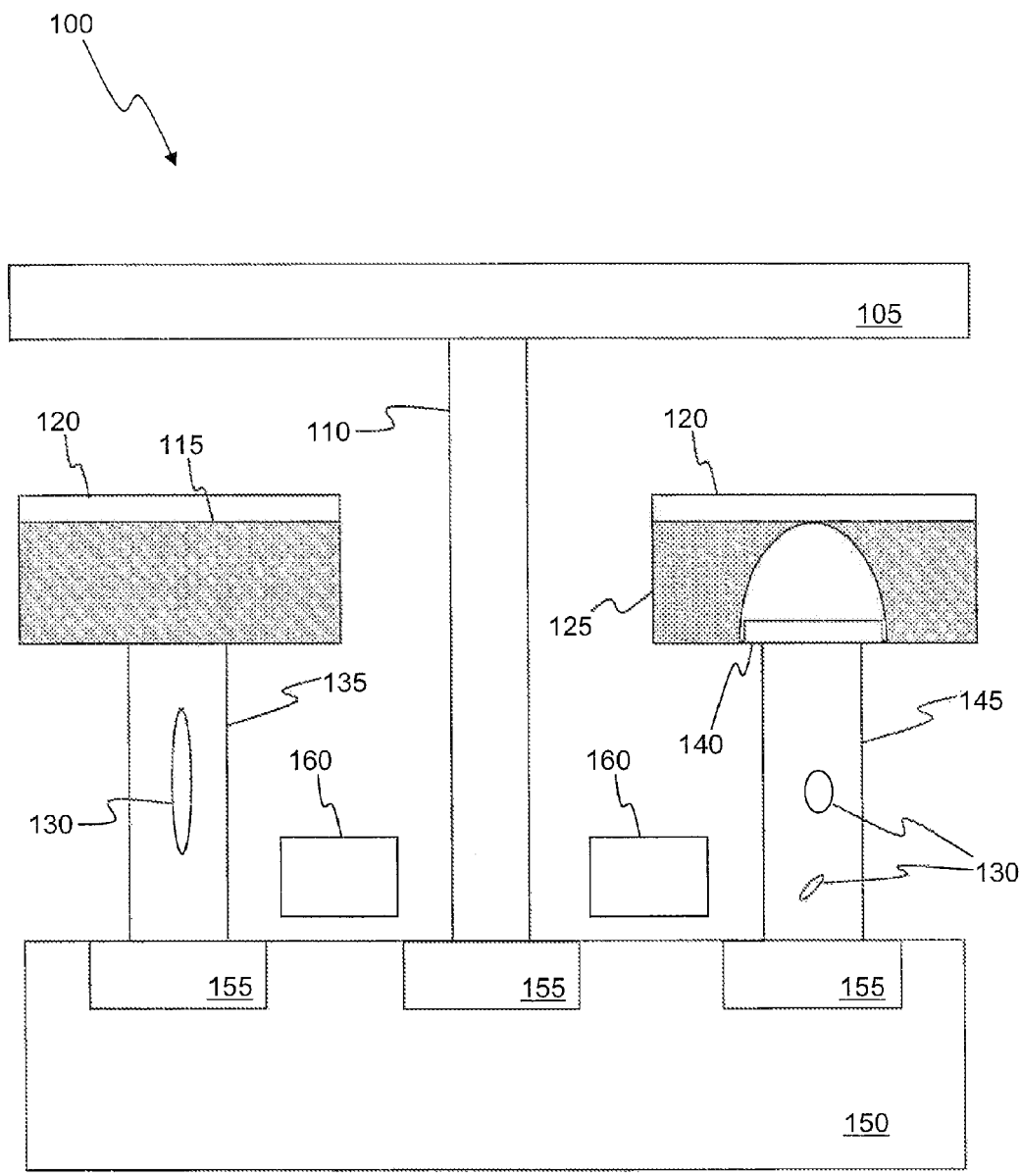
FIG. 1 is a schematic view of a portion of phase change memory, according to an embodiment.

FIG. 1 is a schematic view of a portion of phase change memory 100, according to an embodiment. Such a portion is shown to include two memory cells, each memory cell being in a different memory state for illustrative purposes. A semiconductor substrate 150 may include N-doped regions 155, though other configurations, including the use of P-doped regions for example, may be used. Phase change memory 100 may include word lines 160, bit line 105, and bit line contact 110. To represent one memory state, a heater 145 contacting a portion of phase change material 125 may heat to melt a portion 140 of phase change material 125, which may then be cooled relatively quickly to comprise amorphous germanium antimony tellurium (GST), for example. Such an amorphous material may be relatively highly resistive, resulting in a high-resistance connection to a contact 120. To represent another memory state, a heater 135 contacting a portion of phase change material 115 may heat to melt a portion of phase change material 115, which may then be cooled relatively slowly to comprise a polycrystalline, low-resistance material. Such polycrystalline phase change material 115 may thus lead to a low-resistance connection to contact 120. Of course, details of such a portion of a PCM are merely examples, and claimed subject matter is not so limited.

As shown in FIG. 1, heater 135 may develop voids 130 during fabrication of heater 135 and/or heater 145. Such voids 130 may detrimentally increase resistance of a connection to contact 120, leading to malfunctioning of the memory cell. For example, such a failed memory cell may fail to switch memory states and/or properly write data. Thus eliminating and/or reducing a size/number of such voids 130 may benefit memory cell operation.

Figure 2:
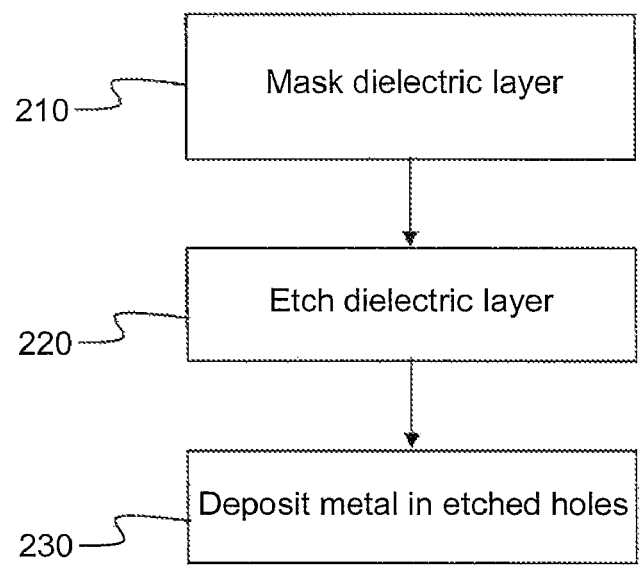
FIG. 2 is a flow diagram of a fabrication process, according to an embodiment.

FIG. 2 is a flow diagram of a fabrication process 200, according to an embodiment. For example, process 200 may be used to form a portion of a memory device. At block 210 a dielectric layer may be masked with an etch mask having a plurality of round holes. Such a dielectric layer may comprise an oxide, for example. In one particular implementation, placement of such holes in an etch mask may correspond to placement of individual heaters for memory cells of a PCM array, though claimed subject matter is not so limited. At block 220, a dielectric layer may be etched according to a pattern of the etch mask using an etch gas to produce holes having sloping, linear sides in the dielectric layer. Here, linear sides may comprise sides of an etched hole that have a linear profile that is substantially linear from a bottom of the etched hole to a top of the etched hole. In other words, sides of an etched hole having a linear profile may comprise sides that are substantially straight and/or substantially without curves from a bottom to a top of the etched hole. In a particular example, sides of such an etched hole may comprise a truncated conical shape, though claimed subject matter is not so limited. Slope of such sides of an etched hole may be described by a slope angle relative to a bottom and/or top of the etched hole or relative to an axis of the etched hole. For example, such an axis may comprise a central vertical axis extending from the bottom to the top of the etched hole, though claimed subject matter is not so limited. Subsequently, at block 230, a metal and/or other conducting material may be deposited in the holes using a gap-fill or damascene process to form plugs having sloping, linear sides. As described herein, such plugs may be absent a keyhole and/or other voids.

Figure 3:
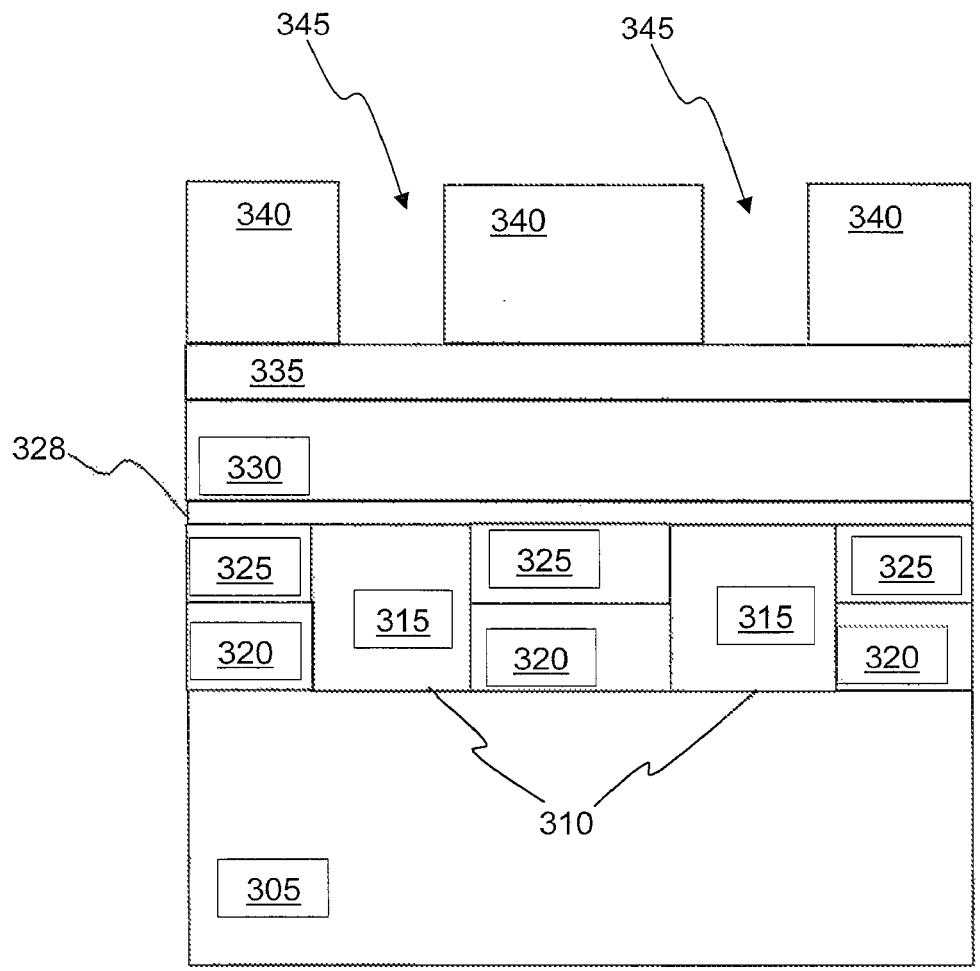
FIG. 3 is a cross-sectional view of a semiconductor structure, according to an embodiment.

FIG. 3 is a cross-sectional view of a semiconductor structure 300, according to an embodiment. Line 305 may comprise a conductive material such as a metal, for example, on which a nitride layer 320 may be deposited. An oxide layer 325, along with nitride layer 320 may at least partially surround a titanium nitride line 315. In a particular implementation, a tantalum nitride 310 may be formed between titanium nitride line 315 and nitride layer 320 and oxide layer 325. An additional nitride layer 328 and a dielectric layer 330 may cover a plurality of titanium nitride lines 315. In one implementation, a bottom antireflective coating (BARC) 335 may be deposited before photo-resist 340. Using an etch mask (not shown), photo-resist 340 may be patterned to provide round holes 345. Of course, such details of a semiconductor structure are merely examples, and claimed subject matter is not so limited.

Figure 4:
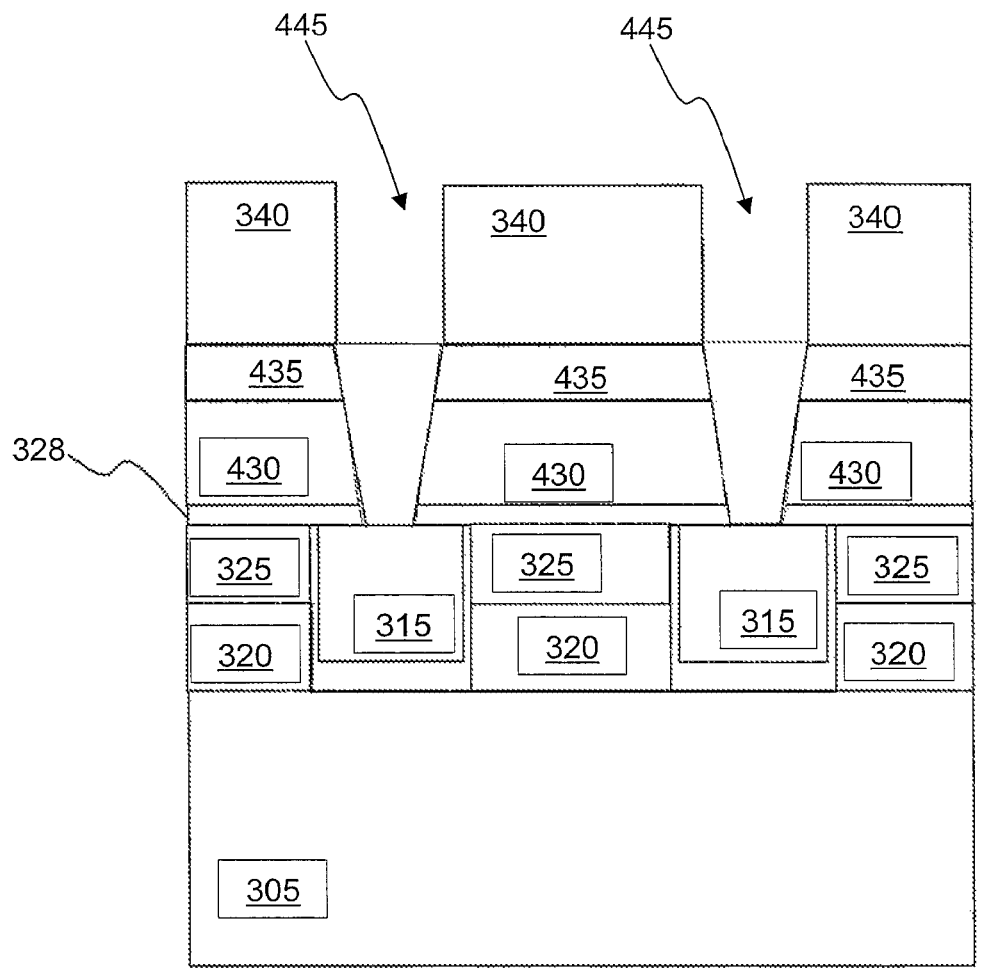
FIG. 4 is a cross-sectional view of a semiconductor structure, according to another embodiment.

FIG. 4 is a cross-sectional view of a semiconductor structure 400, according to another embodiment. Semiconductor structure 400 may comprise a structure resulting from structure 300 subsequent to an etching process, such as performed at block 220 shown in FIG. 2, for example. Here, such an etching process may comprise selective etching to etch BARC 335 and dielectric layer 330 to result in a patterned BARC 435 and a patterned dielectric layer 430, respectively. Nitride layer 328 may act as an etch-stop layer during etch process 220. Subsequently, nitride layer 328 may be removed to expose titanium nitride lines 315. Resulting etched holes 445 may have sloped, linear sidewalls, though such features may be depend, at least in part, on etching conditions of etch process 220, as described in detail below. As discussed above, sloped, linear sidewalls of etched holes 445, if filled with a metal or other material, may allow formation of a keyhole-free semiconductor component, such as a PCM heater, for example.

In an embodiment, etched round holes, such as etched holes 445 shown in FIG. 4, for example, may have sloped, linear sidewalls that may be described by a top diameter, a bottom diameter, and/or a concomitant slope angle. Herein, a top of etched hole 445 is defined to be the end of the etched hole 445 from where an etching process begins, while a bottom of etched hole 445 is defined to be opposite to the top. Herein, a slope angle is defined to be an angle between a linear sloped sidewall of etched hole 445 and a substantially flat bottom of etched hole 445. Accordingly, for example, a sidewall having a slope angle of 90.0 degrees comprises a vertical sidewall (though in such a particular example, such sidewalls are not actually sloped).

As mentioned above, a sidewall slope angle of etched hole 445 may be determined, at least in part, by particular details of an etch process used to fabricate the etched holes. For example, an etch process may involve parameters such as chemical selection of etchant, etchant flow rate, RF power of plasma etchant, etchant chamber pressure and temperature, and/or argon gas flow in the etchant chamber, just to name a few examples. In an implementation, etchant may comprise fluorine, carbon, and/or hydrogen in forms such as $CH_3F$, $CH_2F_2$, $CHF_3$, $CF_4$, $C_4F_8$, and/or $C_4F_6$, for example. Several other particular parameters may play a relatively important role in determining, at least in part, slope angle. Such particular parameters, and their corresponding etch conditions, are described in detail below.

Figure 5:
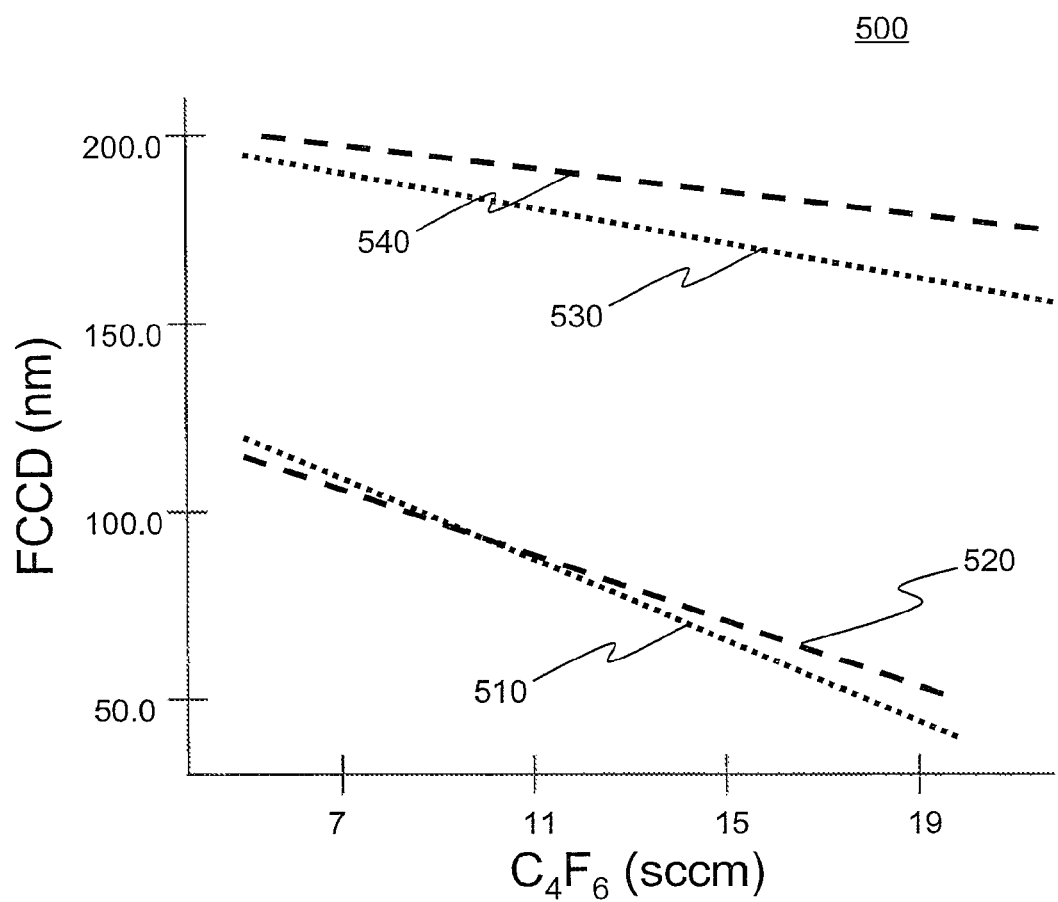
FIGS. 5 and 6 show example graphs, according to an embodiment.

FIG. 5 shows an example graph 500 of final check critical dimension (FCCD) of etched holes plotted against flow rate of etchant $C_4F_6$, according to an embodiment. Here, FCCD may comprise a measurement of a CD after an etch-ash-clean portion of an etching process, for example. Such measurements may be performed for etched holes on a semiconductor wafer. In an implementation, different portions of a semiconductor wafer may undergo unintentional slight variations of etching conditions. In order to account for such variations, some of the following measurements may be performed for etched holes in a substantially central region of a semiconductor wafer while other measurements may be performed in a region substantially near an edge of the semiconductor wafer. In the following description, FCCD measured in an edge region of a semiconductor wafer will be referred to as edge-FCCD, whereas FCCD measured in a central region of a semiconductor wafer will be referred to as center-FCCD. Though plotted lines are linear, such lines may comprise a linearization of nonlinear test results, for example, and claimed subject matter is not limited to such plotted values or relationships. Such graphs are merely examples of measurements to illustrate one or more embodiments described herein.

Figure 6:
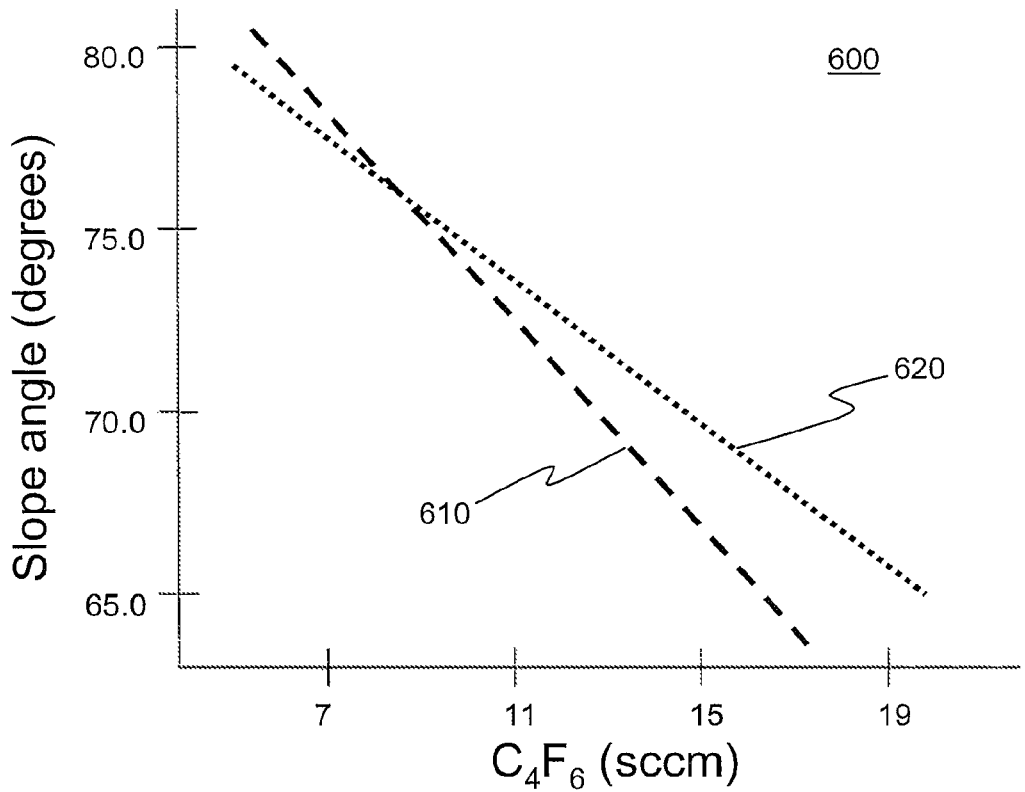

Returning to FIG. 5, line 510 is a plot of edge-FCCD versus etchant flow rate for a bottom diameter of an etched hole. Line 520 is a plot of center-FCCD versus etchant flow rate for a bottom diameter of an etched hole. Line 530 is a plot of edge-FCCD versus etchant flow rate for a top diameter of an etched hole. Line 540 is a plot of center-FCCD versus etchant flow rate for a top diameter of an etched hole. As indicated in FIG. 5, as a flow rate of etchant $C_4F_6$ increases, the diameter of the bottom of the etched hole decreases at a faster rate than that of the top of the etched hole. Such a rate difference may result in a slope angle that decreases as flow rate increases, as shown in FIG. 6, for example. Here, line 610 is a plot of slope angle versus flow rate of etchant $C_4F_6$ for etched holes in a center region of a semiconductor wafer and line 620 is a plot of slope angle versus flow rate of etchant $C_4F_6$ for etched holes in an edge region of a semiconductor wafer.

Figure 7:
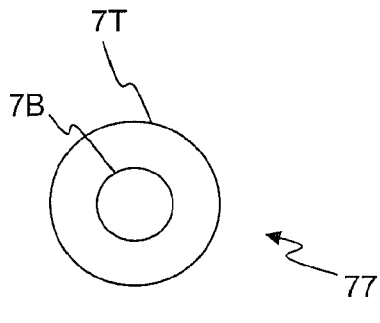
FIGS. 7 and 8 are top views of etched holes, according to an embodiment.
Figure 8:
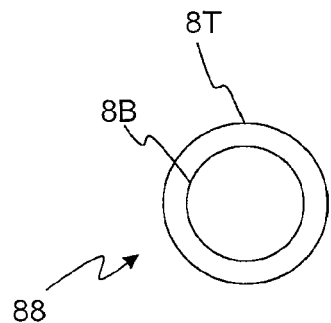

FIGS. 7-8 are schematic top views of etched holes produced using different flow rates of etchant gas $C_4F_6$, according to an embodiment. For example, for the etched hole 77, a flow rate of approximately 16 standard cubic centimeters (sccm) was used, whereas for the etched hole 88, a flow rate of approximately 10 sccm was used. Inner circles 7B and 8B represent bottoms of etched holes and outer circles 7T and 8T represent tops of etched holes. In a particular implementation, for a particular hole depth, slope angle of a linear sidewall of an etched hole may be determined by a difference between top and bottom diameters of an etched hole. For example, for equal hole depths, etched hole 88 has a greater slope angle than that of etched hole 77, agreeing with the plotted relationship shown in FIG. 6. Of course, such plotted relationships and other details regarding etched holes and etching processes are merely examples, and claimed subject matter is not so limited.

Figure 9:
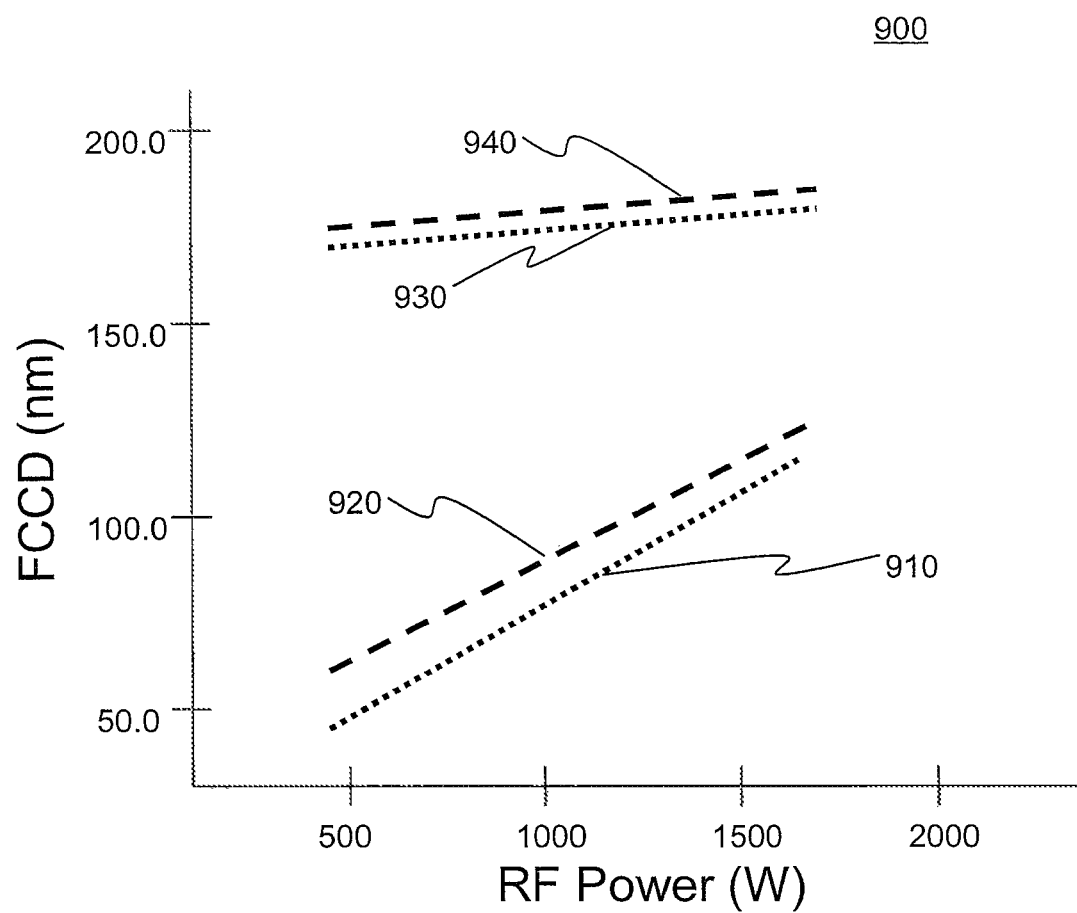

FIG. 9 shows an example graph 900 of FCCD of etched holes plotted against RF power, according to an embodiment. Such RF power may be applied to etchant gas $C_4F_6$ during an etching process, for example. As described above, FCCD may comprise a measurement of a CD after an etch-ash-clean portion of an etching process, for example. Such measurements may be performed for etched holes located in a central or an edge region on a semiconductor wafer. Though plotted lines are linear, such lines may comprise a linearization of nonlinear test results, for example, and claimed subject matter is not limited to such plotted values or relationships. Line 910 is a plot of edge-FCCD versus RF power for a bottom diameter of an etched hole. Line 920 is a plot of center-FCCD versus RF power for a bottom diameter of an etched hole. Line 930 is a plot of edge-FCCD versus RF power for a top diameter of an etched hole. Line 940 is a plot of center-FCCD versus RF power for a top diameter of an etched hole. As indicated in FIG. 9, as RF power for applying etchant $C_4F_6$ increases, the diameter of the bottom of the etched hole increases at a faster rate than that of the top of the etched hole. Such a rate difference may result in a slope angle that increases as RF power increases, as shown in FIG. 10, for example. Here, line 1010 is a plot of slope angle versus RF power for applying etchant $C_4F_6$ for etched holes in a center region of a semiconductor wafer and line 620 is a plot of slope angle versus RF power for applying etchant $C_4F_6$ for etched holes in an edge region of a semiconductor wafer.

FIGS. 11-12 are schematic top views of etched holes produced using different RF powers for applying etchant gas $C_4F_6$, according to an embodiment. For example, for the etched hole 11, an RF power of approximately 700 watts was used, whereas for the etched hole 22, an RF power of approximately 1500 watts was used. Inner circles 11B and 12B represent bottoms of etched holes and outer circles 11T and 12T represent tops of etched holes. In a particular implementation, for a particular hole depth, slope angle of a linear sidewall of an etched hole may be determined by a difference between top and bottom diameters of an etched hole. For example, for equal hole depths, etched hole 22 has a greater slope angle than that of etched hole 11, agreeing with the plotted relationship shown in FIG. 10. Of course, such plotted relationships and other details regarding etched holes and etching processes are merely examples, and claimed subject matter is not so limited.

Figure 13:
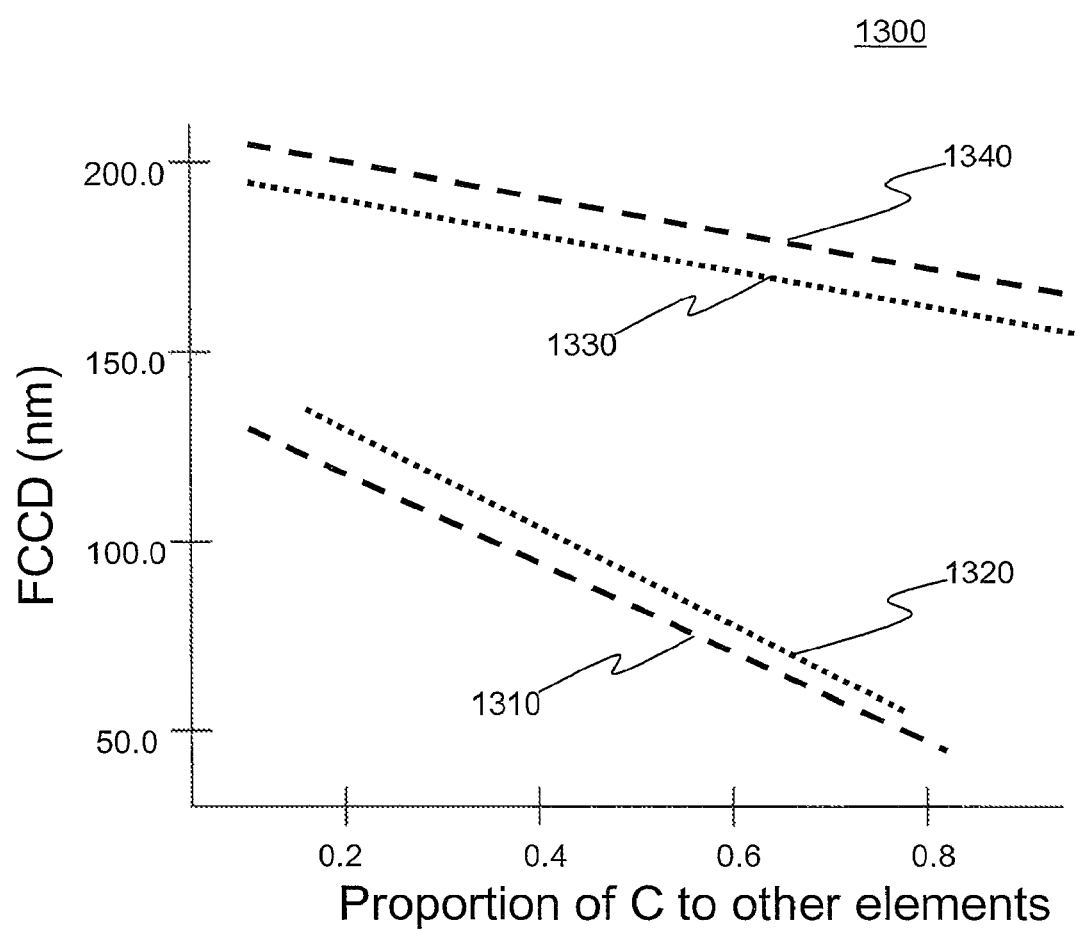

FIG. 13 shows an example graph 1300 of FCCD of etched holes plotted against different etchants, according to an embodiment. Etchants may comprise fluorine, carbon, and/or hydrogen in forms such as $CH_3F$, $CH_2F_2$, $CHF_3$, $CF_4$, $C_4F_8$, and/or $C_4F_6$, for example. Such different etchants may be described by their chemical proportion of carbon to other elements. As described above, FCCD may comprise a measurement of a CD after an etch-ash-clean portion of an etching process, for example. Such measurements may be performed for etched holes located in a central or an edge region on a semiconductor wafer. Though plotted lines are linear, such lines may comprise a linearization of nonlinear test results, for example, and claimed subject matter is not limited to such plotted values or relationships. Line 1310 is a plot of edge-FCCD versus etchant type for a bottom diameter of an etched hole. Line 1320 is a plot of center-FCCD versus etchant type for a bottom diameter of an etched hole. Line 1330 is a plot of edge-FCCD versus etchant type for a top diameter of an etched hole. Line 1340 is a plot of center-FCCD versus etchant type for a top diameter of an etched hole. As indicated in FIG. 13, as the chemical proportion of carbon to other elements of an etchant increases, the diameter of the bottom of the etched hole decreases at a faster rate than that of the top of the etched hole. Such a rate difference may result in a slope angle that decreases as the chemical proportion of carbon to other elements increases, as shown in FIG. 14, for example. Here, line 1410 is a plot of slope angle versus etchants' chemical proportion of carbon to other elements for etched holes in a center region of a semiconductor wafer and line 1420 is a plot of slope angle versus etchants' chemical proportion of carbon to other elements for etched holes in an edge region of a semiconductor wafer.

FIGS. 15-16 are schematic top views of etched holes produced using different etchant gases, according to an embodiment. For example, for the etched hole 55, etchant gas $CH_3F$ was used, whereas for the etched hole 66, etchant gas $C_4F_6$ was used. Inner circles 15B and 16B represent bottoms of etched holes and outer circles 15T and 16T represent tops of etched holes. In a particular implementation, for a particular hole depth, slope angle of a linear sidewall of an etched hole may be determined by a difference between top and bottom diameters of an etched hole. For example, for equal hole depths, etched hole 55 has a greater slope angle than that of etched hole 66, agreeing with the plotted relationship shown in FIG. 14. Of course, such plotted relationships and other details regarding etched holes and etching processes are merely examples, and claimed subject matter is not so limited.

Figure 17:
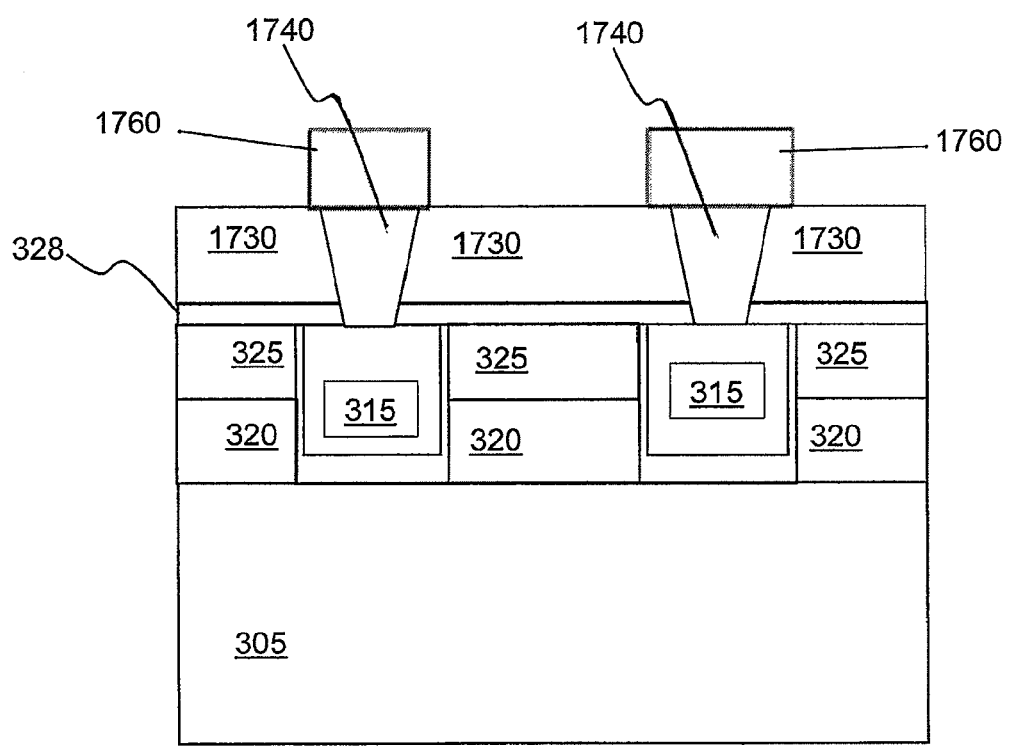
FIG. 17 is a cross-sectional view of a semiconductor structure, according to an embodiment.

FIG. 17 is a cross-sectional view of a semiconductor structure 1700, according to an embodiment. Semiconductor structure 1700 may comprise a structure resulting from structure 400 subsequent to an etching process, such as performed at block 230 shown in FIG. 2, for example. After photo-resist 340 and BARC 435 are removed by an ashing and cleaning process, etched hole 445 may be filled with a metal plug 1740 using a damascene process, for example. Linear, sloped sidewalls of etched hole 445 may allow metal plug 1740 to conform to a size and/or shape of etched hole 445 absent of keyholes and/or other voids. In one particular implementation, metal plug 1740 may comprise TiSiN, contacting titanium nitride line 315, though claimed subject matter is not so limited. In such a case, as discussed above, metal plug 1740 may comprise a heater element for phase change material 1760 of a PCM cell, though claimed subject matter is not so limited.

Figure 18:
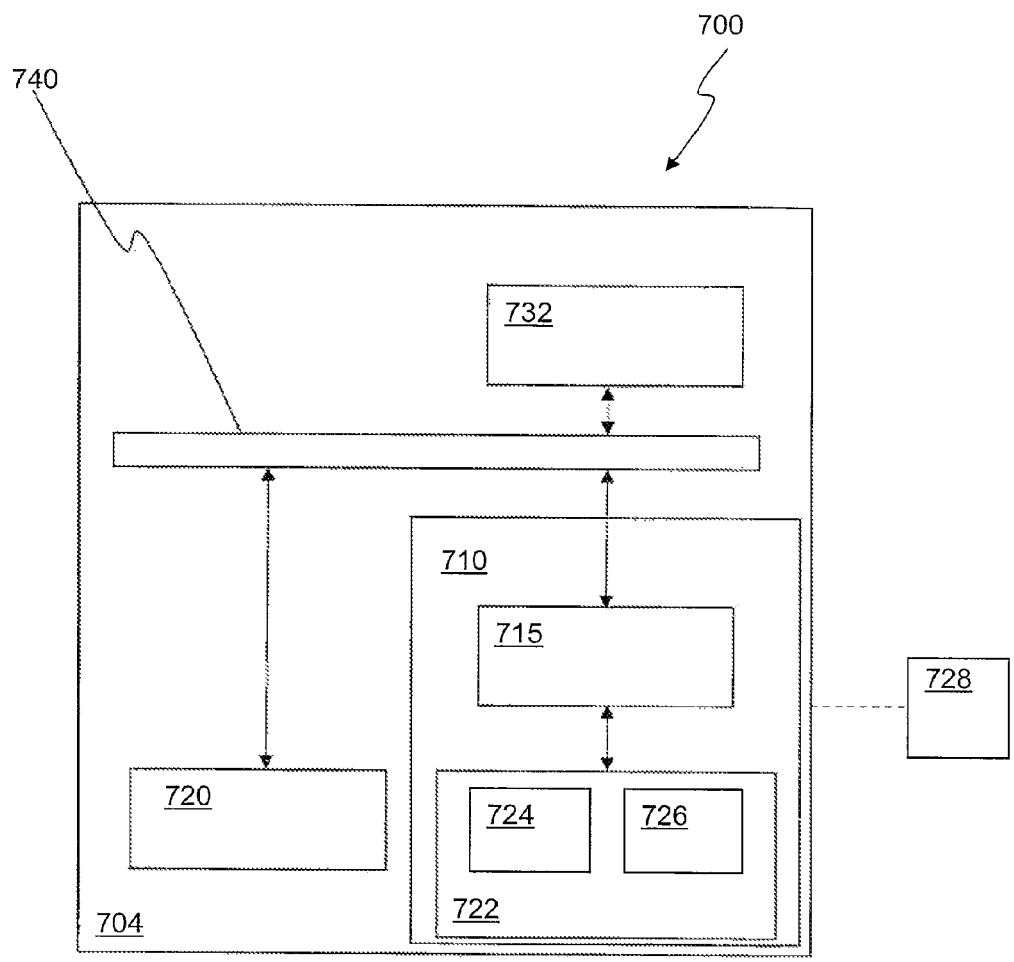
FIG. 18 is a schematic diagram illustrating an exemplary embodiment of a computing system.

FIG. 18 is a schematic diagram illustrating an exemplary embodiment of a computing system 700 including a memory device 710 that may comprise an array of memory cells described above, for example. A computing device 704 may be representative of any device, appliance, and/or machine that may be configurable to manage memory device 710. Memory device 710 may include a memory controller 715 and a memory 722. By way of example but not limitation, computing device 704 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

It is recognized that all or part of the various devices shown in system 700, and processes and methods described herein, may be implemented using or otherwise including hardware, firmware, software, or any combination thereof. Thus, by way of example but not limitation, computing device 704 may include at least one processing unit 720 that is operatively coupled to memory 722 through a bus 740 and a host or memory controller 715. Processing unit 720 is representative of one or more circuits configurable to perform at least a portion of a data computing procedure or process, for example. By way of example but not limitation, processing unit 720 may include one or more processors, controllers, microprocessors, microcontrollers, application specific integrated circuits, digital signal processors, programmable logic devices, field programmable gate arrays, and the like, or any combination thereof. Processing unit 720 may communicate with memory controller 715 to process and/or initiate memory-related operations, such as read, write, and/or erase. For example, processing unit 720 may instruct memory controller 715 to apply a program pulse to one or more particular memory cells in memory device 710. Processing unit 720 may include an operating system configured to communicate with memory controller 715. Such an operating system may, for example, generate commands to be sent to memory controller 715 over bus 740.

Memory 722 is representative of any data storage mechanism. Memory 722 may include, for example, a primary memory 724 and/or a secondary memory 726. Primary memory 724 may include, for example, a random access memory, read only memory, etc. While illustrated in this example as being separate from processing unit 720, it should be understood that all or part of primary memory 724 may be provided within or otherwise co-located/coupled with processing unit 720.

Secondary memory 726 may include, for example, the same or similar type of memory as primary memory and/or one or more data storage devices or systems, such as, for example, a disk drive, an optical disc drive, a tape drive, a solid state memory drive, etc. In certain implementations, secondary memory 726 may be operatively receptive of, or otherwise configurable to couple to, a computer-readable medium 728. Computer-readable medium 728 may include, for example, any medium that can carry and/or make accessible data, code and/or instructions for one or more of the devices in system 700.

In one implementation, processing unit 720 may host and/or execute one or more applications to initiate commands to memory controller 715 to store information in and/or retrieve information from a memory device. Such applications may comprise word processing applications, voice communication applications, navigation applications, and so on. Computing device 704 may include, for example, an input/output 732. Input/output 732 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 732 may include an operatively configured display, speaker, keyboard, mouse, trackball, touch screen, data port, etc.

In the above detailed description, numerous specific details are set forth to provide a thorough understanding of claimed subject matter. However, it will be understood by those skilled in the art that claimed subject matter may be practiced without these specific details. In other instances, methods, apparatuses, or systems that would be known by one of ordinary skill have not been described in detail so as not to obscure claimed subject matter.

The terms, "and," "and/or," and "or" as used herein may include a variety of meanings that will depend at least in part upon the context in which it is used. Typically, "and/or" as well as "or" if used to associate a list, such as A, B or C, is intended to mean A, B, and C, here used in the inclusive sense, as well as A, B or C, here used in the exclusive sense. Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A memory device comprising:
    a heater formed in a first dielectric material and a second dielectric material, wherein the heater extends through the first dielectric material and the second dielectric material before contacting a phase change material, and wherein the first dielectric material comprises a material different from the second dielectric material,
    wherein the heater comprises a first end, the first end contacting a portion of the phase change material and configured to melt at least a portion of the phase change material, and a second end opposite the first end, the second end contacting a conductive electrode,
    wherein a top surface of the conductive electrode is at a same level as a top surface of a third dielectric material extending from the conductive electrode to an adjacent conductive electrode in contact with an adjacent heater, and wherein the first dielectric material is over the second dielectric material, and the second dielectric material extends substantially continuously from the heater to the adjacent heater and is substantially over and in contact with the conductive electrode, the adjacent conductive electrode and the third dielectric material, wherein the third dielectric material comprises a material different from the second dielectric material, wherein sides of the heater have a linear profile, and wherein the sides are sloped with respect to a vertical axis of the heater such that the first end of the heater contacting the phase change material has a width that is larger than a width of the second end of the heater contacting the conductive electrode.

2. The memory device of claim 1, wherein the phase change material comprises germanium antimony tellurium (GST).

3. The memory device of claim 1, wherein the heater comprises TiSiN.

4. The memory device of claim 1, wherein the sides are sloped with respect to the vertical axis of the heater at an angle in a range of about 80 degrees to about 81 degrees.

5. The memory device of claim 1, wherein the linear profile of the sides extends substantially from the upper end of the heater to the opposite lower end of the heater.

6. The memory device of claim 5, wherein the heater has a truncated conical shape.

7. The memory device of claim 5, wherein the sides are sloped with respect to the vertical axis of the heater at an angle of about 65 degrees to about 85 degrees.

8. The memory device of claim 5, wherein the sides are sloped with respect to the vertical axis of the heater at an angle of about 65 degrees to about 70 degrees.

9. The memory device of claim 1, wherein the heater is substantially free of keyhole defects.

10. A system comprising:
a processor to execute one or more applications stored in a memory cell array; and
a controller to apply a write and/or an erase process to the memory cell array, wherein the memory cell array comprises:
a memory cell including a heater formed in a first dielectric material and a second dielectric material, wherein the heater extends through the first dielectric material and the second dielectric material before contacting a phase change material, and wherein the first dielectric material comprises a material different from the second dielectric material,
wherein the heater comprises a first end, the first end contacting a portion of the phase change material and configured to melt at least a portion of the phase change material, and a second end opposite the first end, the second end contacting a conductive electrode,
wherein a top surface of the conductive electrode is at a same level as a top surface of a third dielectric material extending from the conductive electrode to an adjacent conductive electrode in contact with an adjacent heater, wherein the first dielectric material is over the second dielectric material, and the second dielectric material extends substantially continuously between the heater and the adjacent heater and the second dielectric material extends substantially continuously from the heater to the adjacent heater and is substantially over and in contact with the conductive electrode, the adjacent conductive electrode and the third dielectric material, wherein the third dielectric material comprises a material different from the second dielectric material, wherein sides of the heater comprise a linear profile, and wherein the sides are sloped with respect to a vertical axis of the heater such that the first end of the heater contacting the phase change material has a width that is larger than a width of the second end of the heater contacting the conductive electrode.

11. The system of claim 10, wherein the phase change material comprises germanium antimony tellurium (GST).

12. The system of claim 10, wherein the heater comprises TiSiN.

13. The system of claim 10, wherein the linear profile of the sides extends substantially from the upper end of the heater to the opposite lower end of the heater.

14. The system of claim 10, wherein the sides substantially maintain a slope angle of about 65 degrees to about 85 degrees with respect to the vertical axis from the upper end to the opposite lower end of the heater.

15. The system of claim 10, wherein the sides substantially maintain a slope angle of about 75 degrees to about 85 degrees with respect to the vertical axis from the upper end to the opposite lower end of the heater.

16. The system of claim 10, wherein the sides substantially maintain a slope angle of about 65 degrees to about 70 degrees with respect to the axis from the upper end to the opposite lower end of the heater.

17. The system of claim 10, wherein the heater has a truncated conical shape.

18. The system of claim 10, wherein the heater is substantially free of keyhole defects.

19. The memory device of claim 1, wherein the conductive electrode comprises a metal-containing conductor.

20. The memory device of claim 19, wherein the metal-containing conductor forms a conductive line.

21. The memory device of claim 19, wherein the metal-containing conductor comprises titanium nitride (TiN).

22. The system of claim 10, wherein the conductive electrode comprises a metal-containing conductor.

23. The system of claim 22, wherein the metal-containing conductor forms a conductive line.

24. The system of claim 22, wherein the metal-containing conductor comprises titanium nitride (TiN).

25. The memory device of claim 1, wherein the second dielectric material comprises an etch-stop layer.

26. The memory device of claim 25, wherein the etch-stop layer comprises a nitride material.

* * * * *